US008043928B2

(12) United States Patent
Sogawa

(10) Patent No.: US 8,043,928 B2
(45) Date of Patent: Oct. 25, 2011

(54) EFFICIENT PROVISION OF ALIGNMENT MARKS ON SEMICONDUCTOR WAFER

(75) Inventor: Koichi Sogawa, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/703,405

(22) Filed: Feb. 10, 2010

(65) Prior Publication Data

US 2010/0262943 A1 Oct. 14, 2010

Related U.S. Application Data

(62) Division of application No. 11/529,621, filed on Sep. 28, 2006, now Pat. No. 7,692,319.

(30) Foreign Application Priority Data

Sep. 30, 2005 (JP) .................................. 2005-287164

(51) Int. Cl.
*H01L 21/76* (2006.01)
(52) U.S. Cl. .. 438/401; 438/462; 257/797; 257/E23.179
(58) Field of Classification Search .................. 438/401, 438/462, 975
See application file for complete search history.

(56) References Cited

U.S. PATENT DOCUMENTS 6,329,700 B1 12/2001 Ishimura et al.

FOREIGN PATENT DOCUMENTS

| JP | 62-54432   | 3/1987 |
|----|------------|--------|
| JP | 8-123011   | 5/1996 |
| JP | 2652015    | 5/1997 |
| JP | 2001-35924 | 2/2001 |
| JP | 2002-237446| 8/2002 |
| JP | 2005-44838 | 2/2005 |

*Primary Examiner* — Kenneth Parker
*Assistant Examiner* — Jose R Diaz
(74) *Attorney, Agent, or Firm* — Cooper & Dunham LLP

(57) ABSTRACT

A semiconductor wafer includes multi chip areas each including two or more device chip areas and arranged in an X-axis direction and a Y-axis direction, a plurality of scribe lines formed parallel to the X axis and the Y axis such as to separate the device chip areas from each other, and one or more alignment marks formed in each of the multi chip areas on the scribe lines between adjacent ones of the device chip areas included in one multi chip area, the one or more alignment marks being fewer than the device chip areas in each of the multi chip areas and used for positioning of the semiconductor wafer.

13 Claims, 5 Drawing Sheets

EFFICIENT PROVISION OF ALIGNMENT MARKS ON SEMICONDUCTOR WAFER

CROSS-REFERENCE TO RELATED APPLICATION

This application is a divisional of U.S. application Ser. No. 11/529,621, filed Sep. 28, 2006, now U.S. Pat. No. 7,692,319, the entire contents of which are incorporated herein by reference.

BACKGROUND

1. Technical Field

This disclosure generally relates to semiconductor wafers, semiconductor-wafer-layout determining methods, and reticle-layout determining methods, and particularly relates to a semiconductor wafer having an alignment mark for positioning the wafer, a semiconductor-wafer layout determining method, and a reticle-layout determining method for implementing the semiconductor-wafer layout determining method.

2. Description of the Related Art

In the manufacturing of semiconductor devices having analog circuits, generally, laser trimming for adjusting resistance by cutting fuses is performed on the wafers in order to improve the analog characteristics of the semiconductor devices. An alignment mark is formed on a semiconductor wafer for the purpose of positioning the semiconductor wafer during such laser trimming process.

A plurality of device chip areas are arranged in matrix form on a semiconductor wafer, and are separated from each other by scribe lines. An alignment mark for use in laser trimming is provided separately for each of the device chip areas (see Patent Document 1, for example).

In the laser trimming process, an alignment mark is utilized to position the semiconductor wafer and align the angle (Θ).

[Patent Document 1] Japanese Patent Application Publication No. 2001-35924

In recent years, progress in the miniaturization of semiconductor devices has been made, resulting in the size of device chip areas being decreased. This makes it difficult to dispose an alignment mark in each device chip area.

Provision of an alignment mark in a device chip area means an increase in the size of the device chip area, resulting in a decrease in the number of device chip areas provided on a semiconductor wafer. This gives rise to a problem that the manufacturing cost increases.

Further, even if an alignment mark is arranged on a scribe line, the provision of alignment marks for respective device chip areas may create interference with other cells that are arranged on scribe lines. Because of this, there may be a situation where alignment marks cannot be disposed as desired. In such a case, the width of the scribe lines may need to be widened. This means an increase in the width of the scribe lines, resulting in a decrease in the number of device chip areas provided on a semiconductor wafer. This gives rise to a problem that the manufacturing cost increases.

Accordingly, there is a need for a semiconductor wafer, a semiconductor-wafer layout determining method, and a reticle-layout determining method for implementing the semiconductor-wafer layout determining method that can arrange alignment marks without enlarging device chip areas or widening the width of scribe lines.

SUMMARY

In an aspect of this disclosure, there is provided a semiconductor wafer which includes multi chip areas each including two or more device chip areas and arranged in an X-axis direction and a Y-axis direction, a plurality of scribe lines formed parallel to the X axis and the Y axis such as to separate the device chip areas from each other, and one or more alignment marks formed in each of the multi chip areas on the scribe lines between adjacent ones of the device chip areas included in one multi chip area, the one or more alignment marks being fewer than the device chip areas in each of the multi chip areas and used for positioning of the semiconductor wafer.

According to another aspect, a method of determining a layout of a semiconductor wafer which includes a plurality of device chip areas arranged in matrix form, scribe lines separating the device chip areas from each other, and alignment marks formed on the scribe lines for positioning of the semiconductor wafer is provided. The method includes arranging, in an X-axis direction and a Y-axis direction on a principal surface of the semiconductor wafer, multi chip areas each including two or more device chip areas, providing scribe lines extending in the X-axis direction and in the Y-axis direction, and arranging one or more alignment marks in each of the multi chip areas on the scribe lines between adjacent ones of the device chip areas included in one multi chip area, the one or more alignment marks being fewer than the device chip areas in each of the multi chip areas.

In this application, the term "alignment mark" means an alignment mark that can be used for positioning in the X-axis direction and the Y-axis direction. Such alignment mark may be of an L-character shape, may be of a cross shape, or may be a set of two alignment marks having their respective longitudinal directions perpendicular to each other.

According to another aspect, multi chip areas each including two or more device chip areas are arranged, and a plurality of scribe lines are formed such as to separate the device chip areas from each other, with one or more alignment marks formed in each of the multi chip areas on the scribe lines between adjacent ones of the device chip areas included in one multi chip area, such that the one or more alignment marks are fewer than the device chip areas in each of the multi chip areas. With this provision, there is no need to dispose the alignment marks around each and every single one of the device chip areas, so that the alignment marks can be arranged without enlarging the device chip areas or widening the width of the scribe lines.

Since the alignment marks are formed between adjacent device chip areas included in one multi chip area, the following advantages are provided.

(a) No alignment mark is arranged on the perimeter of the multi chip areas.

(2) Since no alignment mark is formed on a scribe line on the border between adjacent multi chip areas, there is no need to widen the width of a scribe line on the border between adjacent multi chip areas.

When the device chip areas included in each one of the multi chip areas are arranged such as to include one device chip area in the X-axis direction and two device chip areas in the Y-axis direction, and the number of the one or more alignment marks formed in each one of the multi chip areas is one, there is no need to dispose the alignment marks around each and every single one of the device chip areas, so that the alignment marks can be arranged without widening the width of the scribe lines.

Further, when the number of the one or more alignment marks formed in each one of the multi chip areas is only one, an alignment mark formed in another multi chip area may be utilized to perform positioning and angle alignment of the semiconductor wafer.

When the device chip areas included in each one of the multi chip areas are arranged such as to include one device chip area in the X-axis direction and three or more device chip areas in the Y-axis direction, and two alignment marks are arranged in the Y-axis direction on two respective scribe lines that are apart from each other in the Y-axis direction, there is no need to dispose the alignment marks around each and every single one of the device chip areas, so that the alignment marks can be arranged without widening the width of the scribe lines. In this case, similarly to the manner in the preceding case, an alignment mark formed in another multi chip area may be utilized to perform positioning and angle alignment of the semiconductor wafer.

When the device chip areas included in each one of the multi chip areas are arranged such as to include two device chip areas in the X-axis direction and two device chip areas in the Y-axis direction, and two alignment marks are arranged in the X-axis direction across one of the scribe lines that extends in the Y-axis direction, there is no need to dispose the alignment marks around each and every single one of the device chip areas, so that the alignment marks can be arranged without widening the width of the scribe lines.

In this case, similarly to the manner in the preceding case, an alignment mark formed in another multi chip area may be utilized to perform positioning and angle alignment of the semiconductor wafer.

When the device chip areas included in each one of the multi chip areas are arranged such as to include two or more device chip areas in the X-axis direction and three or more device chip areas in the Y-axis direction, and three alignment marks are situated at positions corresponding to three respective apexes of a right-angle triangle, there is no need to dispose the alignment marks around each and every single one of the device chip areas, so that the alignment marks can be arranged without widening the width of the scribe lines. Since each multi chip area includes two alignment marks arranged in the X-axis direction and two alignment marks arranged in the Y-axis direction, these three alignment marks can be utilized to perform positioning and angle alignment of the semiconductor wafer.

When the device chip areas included in each one of the multi chip areas are arranged such as to include two or more device chip areas in the X-axis direction and three or more device chip areas in the Y-axis direction, and four alignment marks are situated at positions corresponding to four respective corners of a rectangle comprised of two straight lines extending in the X-axis direction and two straight lines extending in the Y-axis direction, unavailability of one of the alignment marks due to its defective shape or the like is recoverable since the remaining alignment marks can be utilized to perform positioning and angle alignment of the semiconductor wafer. With this provision, the yield of semiconductor devices can be improved.

According to another aspect, the method of determining a layout of a semiconductor wafer arranges, in an X-axis direction and a Y-axis direction on a principal surface of the semiconductor wafer, multi chip areas each including two or more device chip areas, provides scribe lines extending in the X-axis direction and in the Y-axis direction, and arrange one or more alignment marks in each of the multi chip areas on the scribe lines between adjacent ones of the device chip areas included in one multi chip area, so that the one or more alignment marks is fewer than the device chip areas in each of the multi chip areas. With this provision, there is no need to dispose the alignment marks around each and every single one of the device chip areas, so that the alignment marks can be arranged reliably even if the size of the device chip areas is small. Further, since the alignment marks are disposed between adjacent device chip areas included in one multi chip area, there is no need to arrange the alignment marks close to alignment marks provided in another multi chip area, thereby eliminating the need to widen the width of the scribe lines.

When the device chip areas included in each one of the multi chip areas are arranged such as to include one device chip area in the X-axis direction and two device chip areas in the Y-axis direction, and a number of the one or more alignment marks arranged in each one of the multi chip areas is one, there is no need to dispose the alignment marks around each and every single one of the device chip areas, so that the alignment marks can be arranged without widening the width of the scribe lines.

When the device chip areas included in each one of the multi chip areas are arranged such as to include one device chip area in the X-axis direction and three or more device chip areas in the Y-axis direction, and two alignment marks are arranged in the Y-axis direction on two respective scribe lines that are apart from each other in the Y-axis direction, there is no need to dispose the alignment marks around each and every single one of the device chip areas, so that the alignment marks can be arranged without widening the width of the scribe lines.

When the device chip areas included in each one of the multi chip areas are arranged such as to include two device chip areas in the X-axis direction and two device chip areas in the Y-axis direction, and two alignment marks are arranged in the X-axis direction across one of the scribe lines that extends in the Y-axis direction, there is no need to dispose the alignment marks around each and every single one of the device chip areas, so that the alignment marks can be arranged without widening the width of the scribe lines.

When the device chip areas included in each one of the multi chip areas are arranged such as to include two or more device chip areas in the X-axis direction and three or more device chip areas in the Y-axis direction, and three alignment marks are situated at positions corresponding to three respective apexes of a right-angle triangle, there is no need to dispose the alignment marks around each and every single one of the device chip areas, so that the alignment marks can be arranged without widening the width of the scribe lines. Since each multi chip area includes two alignment marks arranged in the X-axis direction and two alignment marks arranged in the Y-axis direction, these three alignment marks can be utilized to perform positioning and angle alignment of the semiconductor wafer.

In the case described above, when four alignment marks in each multi chip area are situated at positions corresponding to four respective corners of a rectangle comprised of two straight lines extending in the X-axis direction and two straight lines extending in the Y-axis direction, unavailability of one of the alignment marks due to its defective shape or the like is recoverable since the remaining alignment marks can be utilized to perform positioning and angle alignment of the semiconductor wafer.

According to another aspect, the method of determining a layout of a reticle arranges, on an exposure surface of the reticle, combined chip forming areas each including two or more device chip forming areas for forming the device chip areas of a semiconductor wafer, such that the combined chip forming areas are formed as many as possible, by taking into account an exposure area defined in an exposure apparatus, based on an extension of the exposure area in the X-axis direction, an extension of the exposure area in the Y-axis direction, and an extension of the exposure area in a diagonal direction. A reticle made by use of this layout determining method is used in an exposure process, thereby making a semiconductor wafer having the aforementioned layout.

BRIEF DESCRIPTION OF THE DRAWINGS

The aforementioned and other aspects, features and advantages will be apparent from the following detailed description when read in conjunction with the accompanying drawings, in which.

DESCRIPTION OF THE PREFERRED EMBODIMENTS

Figure 1A:
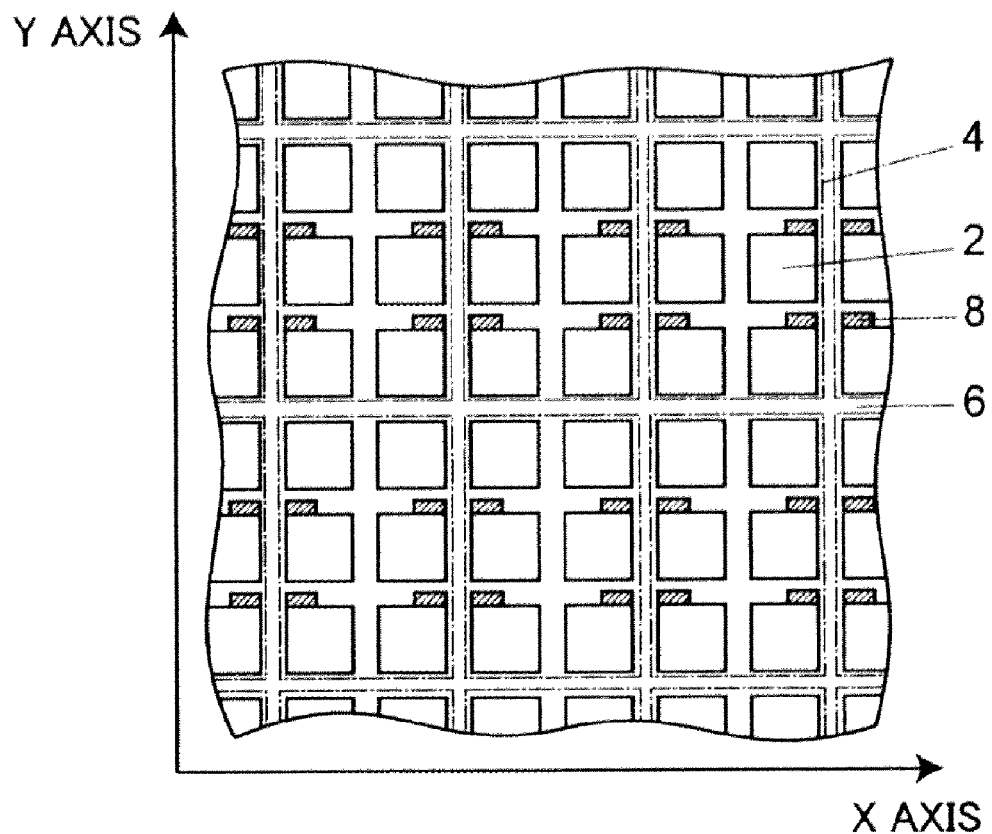
FIGS. 1A and 1B are drawings showing an embodiment of the semiconductor wafer.

In the following, preferred embodiments of the semiconductor wafer of the present invention will be described with reference to the accompanying drawings. In the drawings referred to in this specification, the horizontal direction is referred to as an X-axis direction, and the vertical direction is referred to as a Y-axis direction. Here, the X axis and the Y axis are reference axes perpendicular to each other.

Figure 1B:
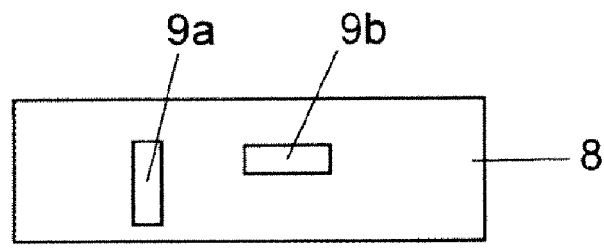

FIGS. 1A and 1B are drawings showing an embodiment of the semiconductor wafer. FIG. 1A is an enlarged view of a layout on the principal surface of the semiconductor wafer, and FIG. 1B is an enlarged view of an alignment cell. In FIGS. 1A and 1B and the drawings referred to in the following, the illustration of device chip areas 2 are intended to include an actual chip area (not shown) for use as an intended product and a guard ring (not shown) formed around the actual chip area.

On the principal surface of the semiconductor wafer, the device chip areas 2 are arranged in matrix form. Further, multi chip areas 4 each comprised of a matrix of device chip areas 2, e.g., two device chip areas 2 arranged in the X-axis direction and three device chip areas 2 arranged in the Y-axis direction, are arranged in matrix form in the X-axis direction and Y-axis direction.

A plurality of scribe lines 6 for separating the device chip areas 2 from each other are formed parallel to the X axis or the Y axis.

On the scribe lines 6 provided inside each of the multi chip areas 4, four alignment cells (alignment marks) 8 are arranged for use in positional alignment for laser trimming, for example.

As shown in FIG. 1B, an alignment cell B has alignment marks 9a and 9b formed therein that are made of polysilicon, for example. The alignment marks 9a and 9b have a rectangular shape as viewed from the above. The alignment mark 9a is positioned such that its longitudinal direction coincides with the Y axis, and the alignment mark 9b is positioned such that its longitudinal direction coincides with the X axis.

The device chip areas 2 has an extension of 1500 micrometers in the X-axis direction and an extension of 2000 micrometers in the Y-axis direction, for example. The width of the scribe lines 6 is 110 micrometers, for example. The size of the alignment cells 8 is 237 micrometers in the X-axis direction and 74 micrometers in the Y-axis direction, for example.

Figure 2:
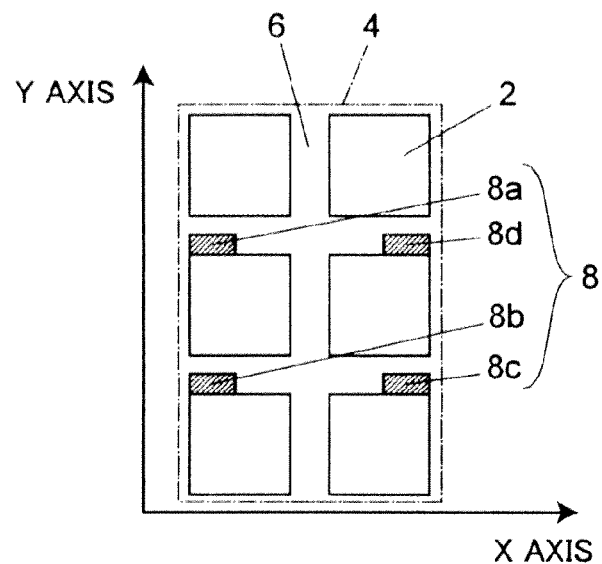
FIG. 2 is an enlarged view of a multi chip area shown in FIG. 1.

FIG. 2 is an enlarged view of a multi chip area 4. As shown in FIG. 2, the alignment cells 8a, 8b, 8c, and 8d are disposed between adjacent device chip areas 2 in a single multi chip area 4.

Further, the alignment cells 8a, 8b, 8c, and 8d are positioned to correspond to the four respective corners of a rectangle that is formed in the multi chip area 4 by two straight lines parallel to the X axis and two straight lines parallel to the Y axis.

The alignment cells 8a and 8d that are arranged in a direction parallel to the X-axis direction are positioned such that the distance between these cells becomes the maximum, and so are the alignment cells 8b and 8c. The arrangement of the alignment cells 8a and 8d and the alignment cells 8b and 8c by maintaining as long a distance as possible from each other makes it possible to improve positioning accuracy and angular alignment accuracy.

In this embodiment, the multi chip area 4 includes the set of the alignment cells 8a and 8d and the set of the alignment cells 8b and 8c, with the cells in each set being arranged in a direction parallel to the X direction, while these alignment cells also form the set of the alignment cells 8a and 8b and the set of the alignment cells 8c and 8d, with the cells in each set being arranged in a direction parallel to the Y direction. These alignment cells are used to allow positioning and angular alignment to be performed in a laser trimming process.

Further, since there are two sets of alignment cells 8 arranged in the X-axis direction and also two sets of alignment cells 8 arranged Y-axis direction, even if the alignment cell 8b cannot be used due to its defective shape, for example, the set of the alignment cells 8a and 8d and the set of the alignment cells 8c and 8d formed by using the three remaining alignment cells may be used to perform positioning and angular alignment for laser trimming.

Moreover, the alignment cells 8 are disposed between adjacent device chip areas 2 in the multi chip area 4, and are not disposed on the perimeter of the multi chip area 4. There is thus no need to ensure that the scribe lines 6 on the borders with the adjacent multi chip areas 4 have width broader than or equal to the width for two alignment cells 8.

Figure 3:
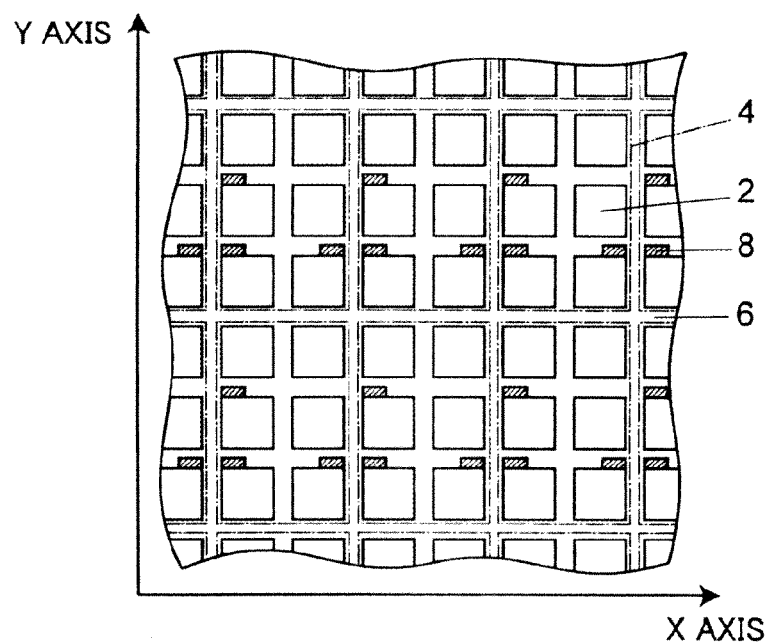
FIG. 3 an enlarged view of another embodiment of a layout on the principal surface of a semiconductor wafer.
Figure 4:
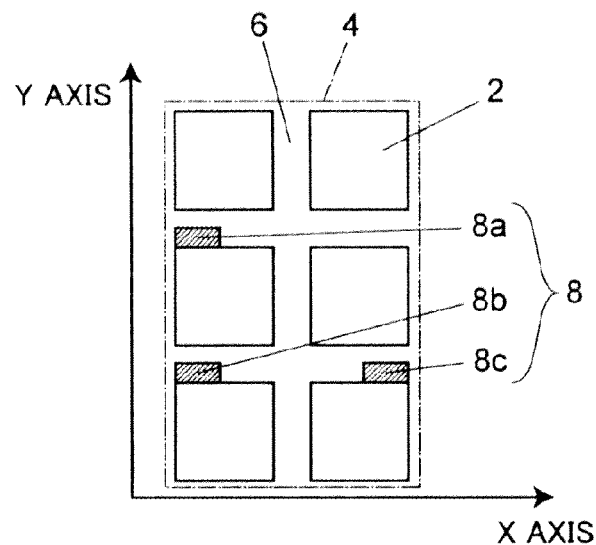
FIG. 4 is an enlarged view of a multi chip area shown in FIG. 3.

In this embodiment, the four alignment cells 8a, 8b, 8c, and 8d are provided in each of the multi chip areas 4. Alternatively, as shown in FIG. 3 and FIG. 4, three alignment cells 8a, 8b, and 8c may be provided in each of the multi chip areas 4. When the three alignment cells 8a, 8b, and 8c are disposed in each of the multi chip areas 4, these alignment cells may be positioned such as to correspond to the three respective corners (apexes) of a right-angle triangle, for example. With this configuration, the multi chip area 4 includes the set of the alignment cells 8a and 8b arranged in a direction parallel to the Y direction and the set of the alignment cells 8b and 8c arranged in a direction parallel to the X direction. These alignment cells are used to allow positioning and angular alignment to be performed in a laser trimming process.

If any one of the three alignment cells 8a, 8b, and 8c is not usable for the purpose of positioning or angle alignment due to some reason such as its defective shape, some of the alignment cells 8 provided in an adjacent multi chip area 4 may be used to perform positioning and angle alignment, which is different from the situation described in connection with FIGS. 1A and 1B and FIG. 2.

In FIG. 3 and FIG. 4, the alignment cells 8b and 8c that are arranged in a direction parallel to the X-axis direction are positioned such that the distance between these cells becomes the maximum. The arrangement of the alignment cells 8b and 8c by maintaining as long a distance as possible from each other makes it possible to improve positioning accuracy and angular alignment accuracy.

In FIGS. 1A and 1B, FIG. 2, FIG. 3, and FIG. 4, each of the multi chip areas 4 is configured such that two device chip areas 2 are arranged in the X-axis direction and three device chip areas 2 are arranged in the Y-axis direction. This is not a limiting example. Each of the multi chip areas 4 may include any number of device chip areas 2 in the X-axis direction and any number of device chip areas 2 in the Y-axis direction. It should be noted, however, that a multi chip area 4 having only one device chip area 2 in the X-axis direction and only one device chip area 2 in the Y-axis direction is excluded.

Figure 5:
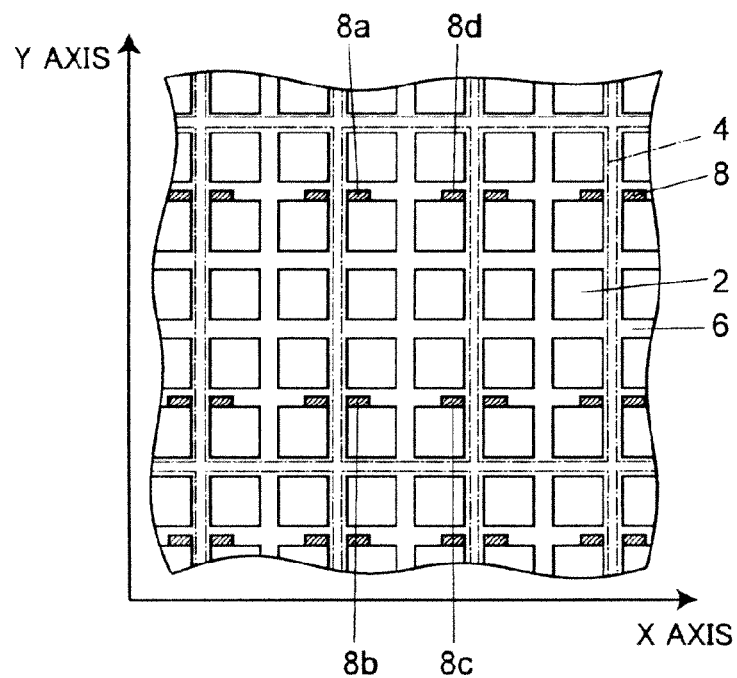
FIG. 5 is a drawing showing another example of the layout on the principal surface of a semiconductor wafer.
Figure 6:
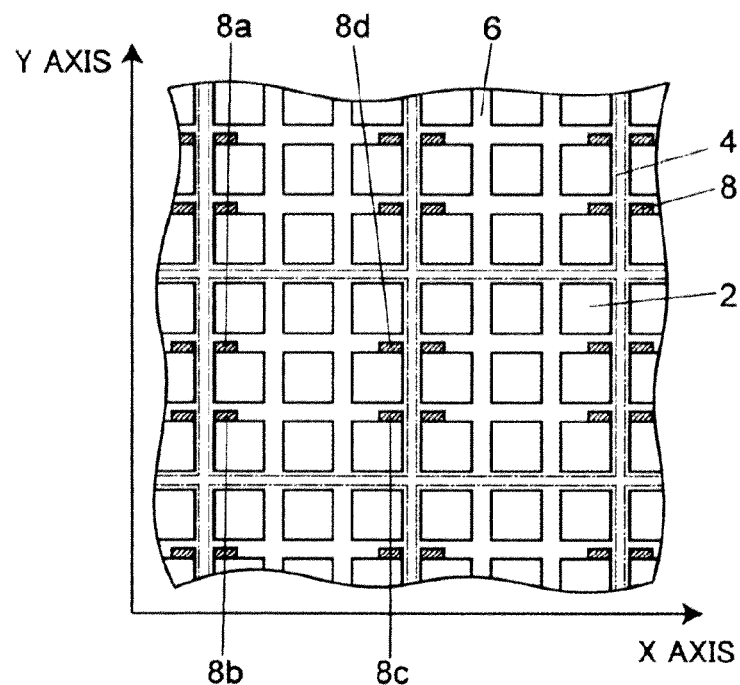
FIG. 6 is a drawing showing another example of the layout on the principal surface of a semiconductor wafer.

FIG. 5 and FIG. 6 are drawings showing other examples of the layout on the principal surface of a semiconductor wafer.

FIG. 5 illustrates an example in which each multi chip area 4 has two device chip areas 2 in the X-axis direction and five device chip areas 2 in the Y-axis direction. The four alignment cells 8a, 8b, 8c, and 8d are disposed on the scribe lines 6 inside each multi chip area 4. Like the alignment cells 8a, 8b, 8c, and 8d shown in FIGS. 1A and 1B and FIG. 2, these alignment cells are disposed between adjacent device chip areas 2 in a single multi chip area 4. The alignment cells 8a and 8d are arranged in a direction parallel to the X-axis direction, and so are the alignment cells 8b and 8c. The alignment cells 8a and 8b are arranged in a direction parallel to the Y-axis direction, and so are the alignment cells 8c and 8d.

The alignment cells 8a and 8d that are arranged in a direction parallel to the X-axis direction are positioned such that the distance between these cells becomes the maximum, and so are the alignment cells 8b and 8c. The alignment cells 8a and 8b that are arranged in a direction parallel to the Y-axis direction are positioned such that the distance between these cells becomes the maximum, and so are the alignment cells 8c and 8d. The arrangement of the two alignment marks that maintains as long a distance as possible between these two alignment marks, whether they are arranged in the X-axis direction or in the Y-axis direction, makes it possible to improve positioning accuracy and angular alignment accuracy.

FIG. 6 illustrates an example in which each multi chip area 4 has three device chip areas 2 in the X-axis direction and three device chip areas 2 in the Y-axis direction. As in the examples shown in FIGS. 1A and 1B, FIG. 2, and FIG. 5, four alignment cells 8 are disposed in each multi chip area 4. Within each multi chip area 4, the alignment cells 8 are disposed between adjacent device chip areas 2. The alignment cells 8a and 8d are arranged in a direction parallel to the X-axis direction, and so are the alignment cells 8b and 8c. The alignment cells 8a and 8b are arranged in a direction parallel to the Y-axis direction, and so are the alignment cells 8c and 8d.

In the example shown in FIG. 6, the alignment cells 8a and 8d that are arranged in a direction parallel to the X-axis direction are positioned such that the distance between these cells becomes the maximum, and so are the alignment cells 8b and 8c. Also, the alignment cells 8a and 8b that are arranged in a direction parallel to the Y-axis direction are positioned such that the distance between these cells becomes the maximum, and so are the alignment cells 8c and 8d. The arrangement of the two alignment marks that maintains as long a distance as possible between these two alignment marks, whether they are arranged in the X-axis direction or in the Y-axis direction, makes it possible to improve positioning accuracy and angular alignment accuracy.

When each multi chip area 4 has two or more device chip areas 2 in the X-axis direction and three or more device chip areas 2 in the Y-axis direction as shown in FIGS. 1A and 1B, FIG. 2, FIG. 5, and FIG. 6, the alignment cells 8 included in each multi chip area 4 may form a set of the alignment cells 8a and 8d and a set of the alignment cells 8b and 8c, with the cells in each set being arranged in the X-axis direction, and also form a set of the alignment cells 8a and 8b and a set of the alignment cells 8c and 8d, with the cells in each set being arranged in the Y-axis direction. In the same manner as shown in FIG. 3 and FIG. 4, however, only one set of alignment cells 8 arranged in the X-axis direction and only one set of alignment cells 8 arranged in Y-axis direction may be provided in each multi chip area 4. Moreover, each multi chip area 4 may include five or more alignment cells 8.

Figure 7:
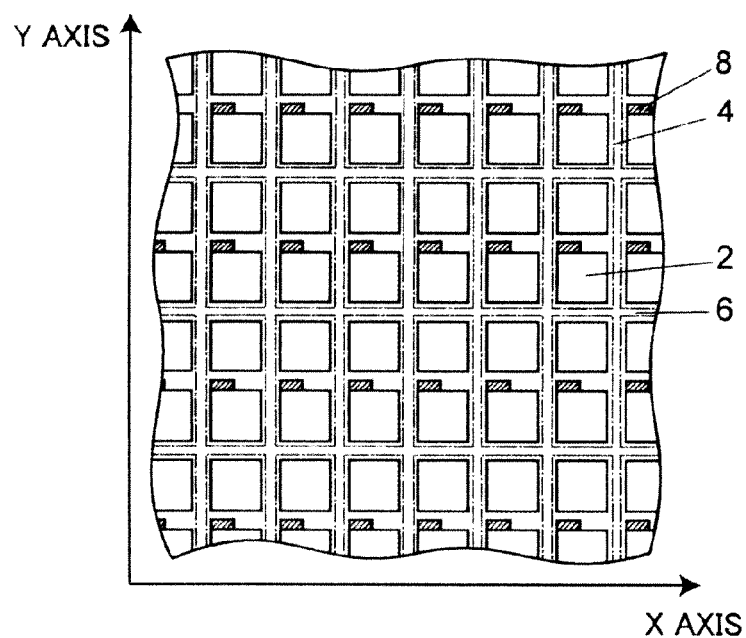
FIG. 7 is a drawing showing another example of the layout on the principal surface of a semiconductor wafer.
Figure 8:
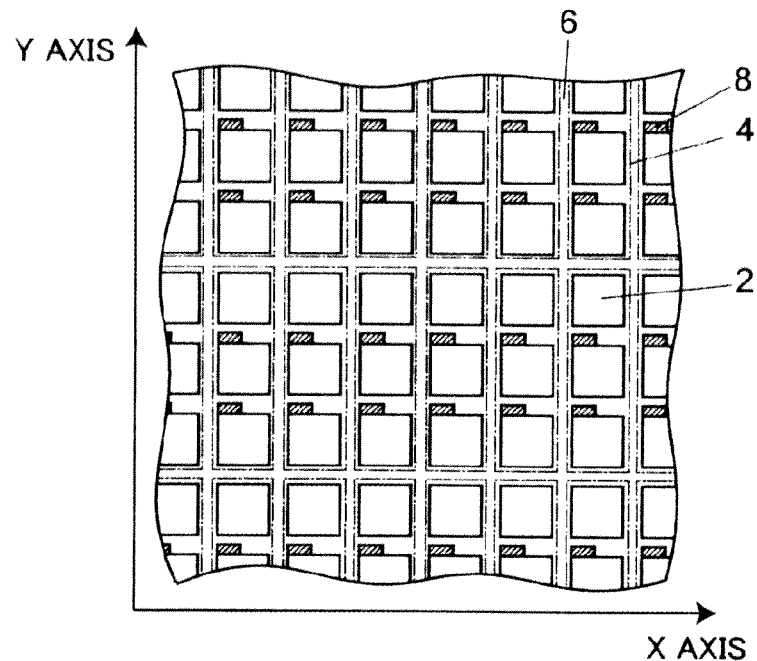
FIG. 8 is a drawing showing another example of the layout on the principal surface of a semiconductor wafer.

FIG. 7 and FIG. 8 are drawings showing other examples of the layout of a semiconductor wafer.

FIG. 7 illustrates an example in which each multi chip area 4 has one device chip area 2 in the X-axis direction and two device chip areas 2 in the Y-axis direction. Each multi chip area 4 include one alignment cell 8 between the two device chip areas 2.

FIG. 8 illustrates an example in which each multi chip area 4 has one device chip area 2 in the X-axis direction and three device chip areas 2 in the Y-axis direction. Each multi chip area 4 includes two alignment cells 8, which are disposed between adjacent device chip areas 2 provided in the same multi chip area 4. These two alignment cells 8 are arranged in a direction parallel to the Y axis.

In FIG. 7 and FIG. 8, each multi chip area 4 has only one device chip area 2 arranged in the X-axis direction, so that two or more alignment cells 8 cannot be arranged in a direction parallel to the X axis due to the limitation imposed by the relative sizes of the device chip areas 2 and the alignment cells 8. In FIG. 7, further, each multi chip area 4 has only two device chip areas 2 arranged in the Y-axis direction, so that only one alignment cell 8 can be provided in order to avoid disposing an alignment cell 8 on the perimeter of the multi chip area 4.

A semiconductor wafer for which the layout as shown in FIG. 7 is provided still allows positioning and angle alignment to be performed if alignment cells 8 disposed in two multi chip areas 4 different from the multi chip area 4 of interest are additionally used.

A semiconductor wafer for which the layout as shown in FIG. 8 is provided still allows positioning and angle alignment to be performed if one alignment cell 4 disposed in a multi chip area 4 different from the multi chip area 4 of interest is additionally used.

In the layout shown in FIG. 8, each of the multi chip areas 4 is configured such that one device chip area 2 is arranged in the X-axis direction and three device chip areas 2 are arranged in the Y-axis direction. This is not a limiting example. Each of the multi chip areas 4 may include one device chip area 2 in the X-axis direction and four or more device chip areas 2 in the Y-axis direction.

Another example of the layout on the principal surface of a semiconductor wafer may be a configuration in which each multi chip area 4 has two device chip areas 2 in the X-axis direction and two device chip areas 2 in the Y-axis direction.

In such a case, each multi chip area 4 may include two alignment cells 8 that are arranged in a direction parallel to the X axis across the scribe line parallel to the Y axis. A semiconductor wafer for which such layout is provided still allows positioning and angle alignment to be performed if an alignment cell 8 disposed in a multi chip area different from the multi chip area of interest for laser trimming is additionally used.

In the layouts described heretofore, the X axis and the Y axis can be swapped without losing any of the features described above.

Figure 9:
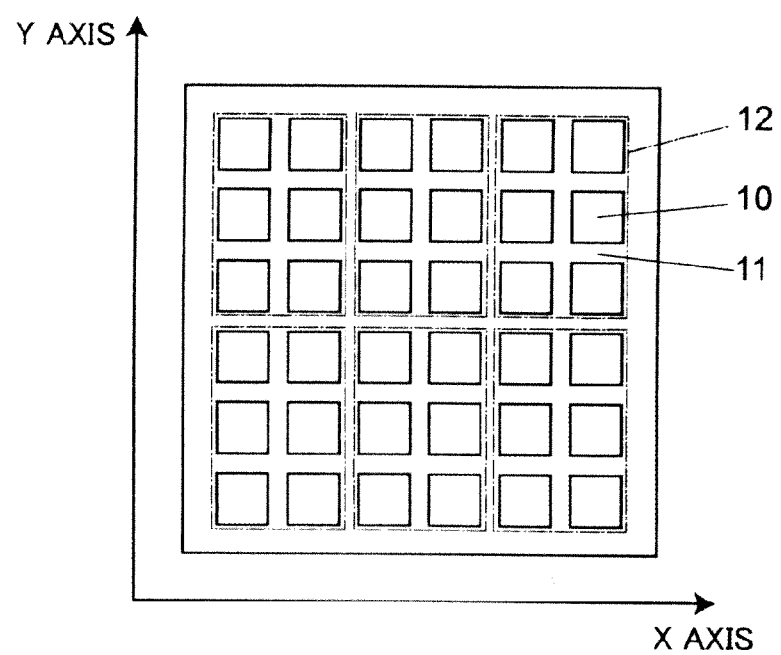
FIG. 9 is a plan view of a reticle exposure surface for explaining an embodiment of a reticle that is provided in accordance with a layout on the principal surface of a semiconductor wafer.

FIG. 9 is a plan view of a reticle exposure surface for explaining an embodiment of a reticle that is provided in accordance with a layout on the principal surface of a semiconductor wafer. The reticle shown in FIG. 9 is made in accordance with the layout shown in FIGS. 1A and 1B and FIG. 2.

The exposure surface of the reticle has device chip forming areas 10 that are arranged in matrix form for the purpose of performing an exposure process on the device chip areas 2 of a semiconductor wafer. Further, scribe-line forming areas 11 are formed in lattice form for the purpose of creating the scribe lines 6 on a semiconductor wafer.

In this reticle, a plurality of combined chip forming areas 12 are provided in one-to-one correspondence to the multi chip area 4 on the semiconductor wafer (see FIGS. 1A and 1B and FIG. 2), and the device chip forming areas 10 are formed in accordance with the arrangement pattern of the combined chip forming areas 12.

The number of the device chip forming areas 10 is determined in response to the number of the combined chip forming areas 12. Namely, since each of the combined chip forming areas 12 has two device chip forming areas 10 in the X-axis direction and three device chip forming areas 10 in the Y-axis direction, the reticle as a whole includes device chip forming areas 10 as many as an integer multiple of two in the X-axis direction (e.g., 6) and an integer multiple of three in the Y-axis direction.

In the manufacturing of a semiconductor device, it is preferable to expose as many device chip areas 2 as possible through one exposure. To this end, the reticle is configured such that there are as many device chip forming areas 10 as possible. The number of the combined chip forming areas 12 in each of the X-axis direction and the Y-axis direction is determined by taking into account the size relations between the device chip forming areas 10, the scribe-line forming areas 11, and the area to be exposed as defined in the exposure apparatus.

The area to be exposed as defined in an exposure apparatus is defined with its extension in the X-axis direction, its extension in the Y-axis direction, and its extension in a diagonal direction (i.e., the length of a diagonal). Even if the number of the combined chip forming areas 12 is determined based on the extension in the X-axis direction and the extension in the Y-axis direction, the extension in the diagonal direction of the determined layout may exceed the extension in the diagonal extension defined in the exposure apparatus. In this case, the number is reduced in the X-axis direction in units of combined chip forming areas 12 rather than in units of device chip forming areas 10.

In the reticle-layout determining method as described above, each of the combined chip forming areas 12 is configured such that two device chip forming areas 10 are arranged in the X-axis direction and three device chip forming areas 10 are arranged in the Y-axis direction. This is not a limiting example. It suffices for each of the combined chip forming areas 12 to include two or more device chip forming areas 10 in at least one of the X-axis direction and the Y-axis direction.

In this embodiment of the reticle-layout determining method, each of the combined chip forming areas 12 is configured such that two device chip forming areas 10 are arranged in the X-axis direction and three device chip forming areas 10 are arranged in the Y-axis direction. This is not a limiting example. In the reticle-layout determining method of the present invention, the arrangement of the device chip forming areas in each combined chip forming area may be modified in response to the semiconductor-wafer-layout determining method of the present invention.

Further, the present invention is not limited to these embodiments, and disclosed shape, material, arrangement, numbers, etc., are just examples, so that various variations and modifications may be made without departing from the scope of the present invention.

In the embodiments described above, disclosed alignment marks are a set of two alignment marks having their respective longitudinal directions perpendicular to each other. The present invention is not limited to this example. L-shape alignment marks or cross-shape alignment marks may as well be used as the alignment marks for the present invention.

Further, the sizes of the device chip areas 2, the scribe lines 6, the alignment cells 8, etc., disclosed in this application are examples used only for the purpose of illustration, and the present invention is not limited to those examples.

The present application is based on Japanese priority application No. 2005-287164 filed on Sep. 30, 2005, with the Japanese Patent Office, the entire contents of which are hereby incorporated by reference.

What is claimed is:

1. A method for determining a layout of a semiconductor wafer which includes a plurality of device chip areas arranged in matrix form, scribe lines separating the device chip areas from each other, and alignment cells formed on the scribe lines for positioning of the semiconductor wafer, said method comprising:

arranging, in an X-axis direction and a Y-axis direction on a surface of the semiconductor wafer, multi chip areas each including two or more device chip areas;

providing scribe lines extending in the X-axis direction and in the Y-axis direction; and arranging one or more alignment cells in each of the multi chip areas on the scribe lines between adjacent ones of the device chip areas included in one multi chip area, the one or more alignment cells being fewer than the device chip areas in each of the multi chip areas, each of the one or more alignment cells being disposed between two opposing straight edges of two adjacent ones of the device chip areas, said each of the one or more alignment cells including (a) a first alignment mark configured to have a longitudinal direction coinciding with the X axis and (b) a second alignment mark configured to have a longitudinal direction coinciding with the Y axis, the two opposing straight edges of the two adjacent ones of the device chip areas being parallel to at least one of the scribe lines, and each of the one or more alignment cells having a size smaller than a width of the scribe lines measured in a width direction of the scribe lines.

2. The method as claimed in claim 1, wherein the device chip areas included in each one of the multi chip areas are arranged to include one device chip area in the X-axis direction and two device chip areas in the Y-axis direction, and a number of the one or more alignment cells arranged in each one of the multi chip areas is one.

3. The method as claimed in claim 1, wherein the device chip areas included in each one of the multi chip areas are arranged to include one device chip area in the X-axis direction and three or more device chip areas in the Y-axis direction, and the one or more alignment cells arranged in each of the multi chip areas are two alignment cells arranged in the Y-axis direction on two respective scribe lines that are apart from each other in the Y-axis direction.

4. The method as claimed in claim 1, wherein the device chip areas included in each one of the multi chip areas are arranged to include two device chip areas in the X-axis direction and two device chip areas in the Y-axis direction, and the one or more alignment cells arranged in each of the multi chip areas are two alignment cells arranged in the X-axis direction across one of the scribe lines that extends in the Y-axis direction.

5. The method as claimed in claim 1, wherein the device chip areas included in each one of the multi chip areas are arranged to include two or more device chip areas in the X-axis direction and three or more device chip areas in the Y-axis direction, and the one or more alignment cells arranged in each of the multi chip areas are at least three alignment cells that are situated at positions corresponding to respective apexes of a right-angle triangle.

6. The method as claimed in claim 5, wherein the one or more alignment cells arranged in each of the multi chip areas are four alignment cells that are situated at positions corresponding to four respective corners of a rectangle comprised of two straight lines extending in the X-axis direction and two straight lines extending in the Y-axis direction.

7. A method for determining a layout of a reticle for implementing the method as claimed in claim 1, comprising:

arranging, on an exposure surface of the reticle, combined chip forming areas each including two or more device chip forming areas for forming the device chip areas of the semiconductor wafer, by taking into account an exposure area defined in an exposure tool, based on an extension of the exposure area in the X-axis direction, an extension of the exposure area in the Y-axis direction, and an extension of the exposure area in a diagonal direction.

8. A method for determining a layout of a semiconductor wafer which includes a plurality of device chip areas arranged in matrix form, scribe lines separating the device chip areas from each other, and alignment cells formed on the scribe lines for positioning of the semiconductor wafer, said method comprising:

arranging, in an X-axis direction and a Y-axis direction on a surface of the semiconductor wafer, two or more device chip areas;

providing scribe lines extending in the X-axis direction and in the Y-axis direction; and arranging one or more alignment cells on the scribe lines between adjacent ones of the device chip areas, each of the one or more alignment cells being disposed between two opposing straight edges of two adjacent ones of the device chip areas, said each of the one or more alignment cells including (a) a first alignment mark configured to have a longitudinal direction coinciding with the X axis and (b) a second alignment mark configured to have a longitudinal direction coinciding with the Y axis, the two opposing straight edges of the two adjacent ones of the device chip areas being parallel to at least one of the scribe lines, and each of the one or more alignment cells having a size smaller than a width of the scribe lines measured in a width direction of the scribe lines.

9. The method as claimed in claim 8, wherein the device chip areas are arranged as a multi chip area to include one device chip area in the X-axis direction and two device chip areas in the Y-axis direction, and a number of the alignment cells formed in the multi chip area is one.

10. The method as claimed in claim 8, wherein the device chip areas are arranged as a multi chip area to include one device chip area in the X-axis direction and three or more device chip areas in the Y-axis direction, and the alignment cells formed in the multi chip area include two alignment cells arranged in the Y-axis direction on two respective scribe lines that are apart from each other in the Y-axis direction.

11. The method as claimed in claim 8, wherein the device chip areas are arranged as a multi chip area to include two device chip areas in the X-axis direction and two device chip areas in the Y-axis direction, and the alignment cells formed in the multi chip area include two alignment cells arranged in the X-axis direction across one of the scribe lines that extends in the Y-axis direction.

12. The method as claimed in claim 8, wherein the device chip areas are arranged as a multi chip area to include two or more device chip areas in the X-axis direction and three or more device chip areas in the Y-axis direction, and the alignment cells formed in the multi chip area include three alignment cells that are situated at positions corresponding to three respective apexes of a right-angle triangle.

13. The method as claimed in claim 12, wherein the alignment cells formed in the multi chip area include four alignment cells that are situated at positions corresponding to four respective corners of a rectangle comprised of two straight lines extending in the X-axis direction and two straight lines extending in the Y-axis direction.

* * * * *